United States Patent [19]

Sismilich

[11] Patent Number: 5,309,556
[45] Date of Patent: May 3, 1994

[54] METHOD FOR USING INTERACTIVE COMPUTER GRAPHICS TO CONTROL ELECTRONIC INSTRUMENTS

[75] Inventor: Robert C. Sismilich, Rockaway, N.J.

[73] Assignee: Hewlett-Packard Company, Palo Alto, Calif.

[21] Appl. No.: 887,574

[22] Filed: May 18, 1992

Related U.S. Application Data

[63] Continuation of Ser. No. 374,599, Jun. 30, 1989, abandoned, which is a continuation of Ser. No. 837,618, Mar. 7, 1986, abandoned.

[51] Int. Cl.⁵ .................................. G06F 15/24
[52] U.S. Cl. .................................. 395/161; 395/155; 315/383
[58] Field of Search ... 364/200 MS File, 900 MS File, 364/141, 146, 188; 315/372, 373, 374; 340/716, 718, 723, 731; 324/121 R, 134; 395/155, 161

[56] References Cited

U.S. PATENT DOCUMENTS

| | | | |
|---|---|---|---|
| 4,001,807 | 1/1977 | Dallimonti | 364/518 |
| 4,422,105 | 12/1983 | Rodesch et al. | 364/521 |
| 4,431,988 | 2/1984 | Molusis et al. | 340/712 |
| 4,510,571 | 4/1985 | Dagostino et al. | 340/723 |
| 4,578,640 | 3/1986 | Crooke et al. | 324/121 R |
| 4,628,444 | 12/1986 | Nozawa et al. | 364/188 |
| 4,634,970 | 1/1987 | Payne et al. | 324/121 R |
| 4,679,135 | 7/1987 | Kobayashi et al. | 364/146 |
| 4,679,137 | 7/1987 | Lane et al. | 364/188 |
| 4,723,207 | 2/1988 | Isobe et al. | 364/171 |
| 4,734,869 | 3/1988 | Mickowski | 364/550 |
| 4,750,135 | 6/1988 | Boilen | 364/514 |
| 4,752,889 | 6/1988 | Rappaport et al. | 364/513 |
| 4,803,039 | 2/1989 | Impink, Jr. et al. | 376/216 |
| 4,823,283 | 4/1989 | Diehm et al. | 364/518 |
| 4,839,818 | 6/1989 | Phillips | 364/477 |
| 4,843,538 | 6/1989 | Lane et al. | 364/188 |
| 4,862,345 | 8/1989 | Lekran | 364/188 |
| 4,901,221 | 2/1990 | Kodosky et al. | 364/200 |
| 4,910,658 | 3/1990 | Dudash et al. | 364/138 |
| 4,967,381 | 10/1990 | Lane et al. | 364/551.01 |

OTHER PUBLICATIONS

Stevens A. "The Use of a Sophisticated Graphics Interface in Computer-Assisted Instruction", IEEE CG 9A Mar./Apr. 1983, pp. 25-32.

*Primary Examiner*—Phu K. Nguyen

[57] ABSTRACT

A system which uses interactive graphics displayed on a viewing means to control and indicate the operating parameters of an instrument. The interactive graphics which are displayed at any point in time depend on the present state of the instrument. Only those controls and indicators which are relevant to the present state will be displayed, which simplifies the display and reduces operator confusion. When the state of the instrument changes, controls and indicators will be redisplayed so as to be relevant to the new state. A control means allows the operator to interact with controls so as to change the state of the instrument. The controls and indicators can be displayed on the viewing means in a way that simulates their physical appearance. A plurality of instruments may be present in the system; if so, the operator can choose which to control, while a subset of parameters of the other instruments can be viewed simultaneously. The preferred method uses a computer program to display the graphics and control the instruments.

6 Claims, 13 Drawing Sheets

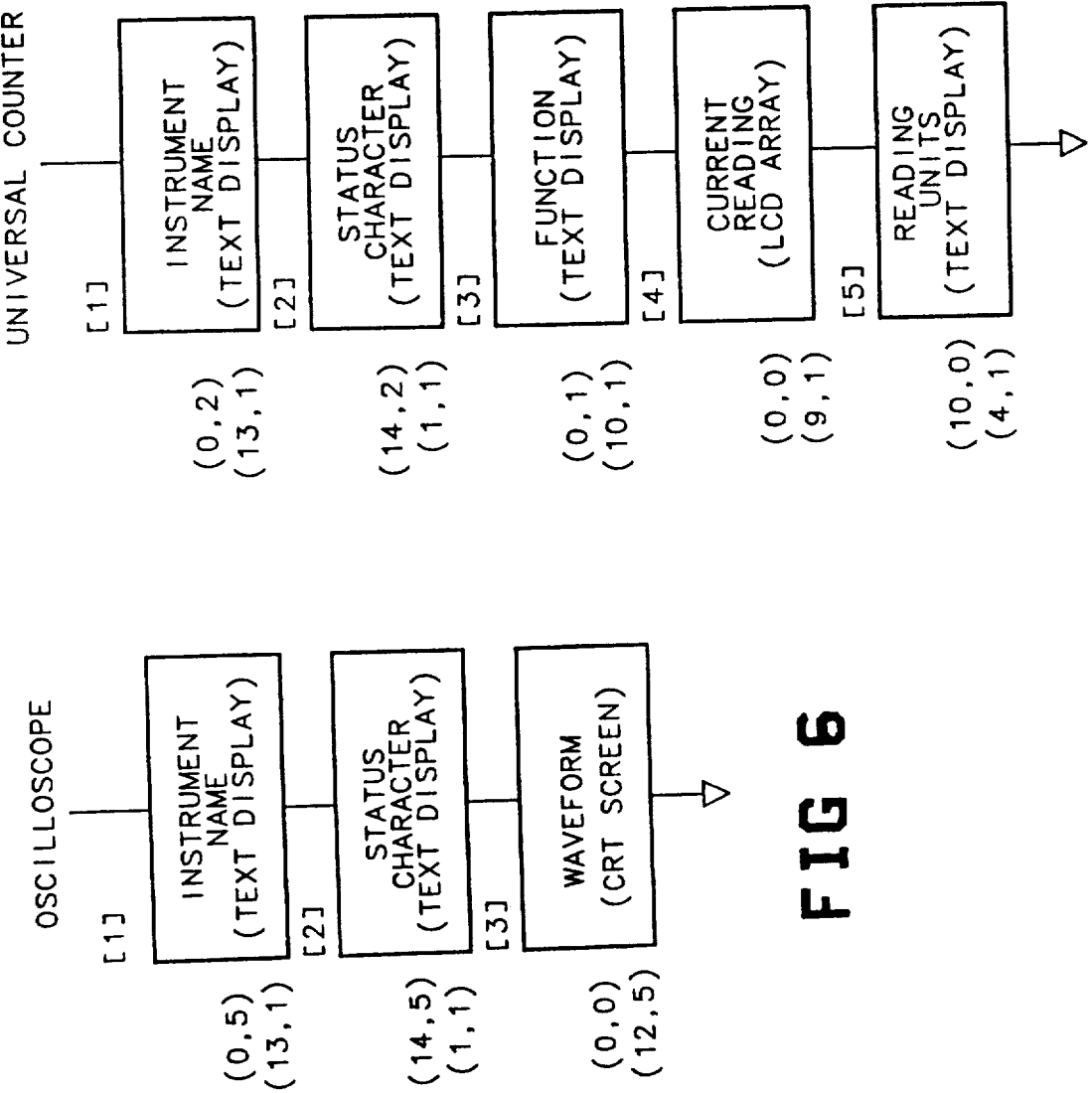

METHOD FOR USING INTERACTIVE COMPUTER GRAPHICS TO CONTROL ELECTRONIC INSTRUMENTS

This is a continuation of copending application Ser. No. 07/374,599 filed on Jun. 30, 1989, now abandoned, which is a continuation of U.S. application Ser. No. 06/837,618 filed on Mar. 7, 1986, now abandoned.

BACKGROUND OF THE INVENTION

In present computer-controlled instrument systems, manual measurements are performed by manual adjustment of controls located on each instrument, and resulting data appears in indicators on each instrument. As those skilled in the art are aware, the number of controls, especially on an instrument such as an oscilloscope, is large enough to cause confusion (see FIG. 13).

BRIEF SUMMARY OF THE INVENTION

The method is a computer program employing interactive computer graphics which draws an image of the controls and indicators of a particular instrument on the computer display. The program allows the operator to move a cursor around the screen and select the instrument function which he wishes to adjust. When he adjusts the graphical image, the corresponding adjustments are made by the computer program to the actual instrument itself.

The electronic instruments are connected to the computer via an interface bus over which the program sends commands and reads back data. A variety of different electronic instruments can be supported including multiple instruments of a single type.

The invention provides a method of displaying multiple, independent instruments on the computer display which are all active at the same time. This allows an operator to be making adjustments to a system using one instrument while observing the effect of these changes in the system on another instrument.

In addition, the invention provides a method of displaying only those controls and indicators of an instrument which are relevant to its current mode of operation. Many electronic instruments have controls and indicators on their front panel which are used only in certain modes. This has the effect of cluttering up the panel, often referred to as "overdensity". Physical controls and indicators on the front panel of an instrument cannot be added or removed, of course. But because computer graphics forms controls and indicators that are only images on the display, they can be drawn only when needed and erased otherwise.

FIG. 4 is a block diagram of a type of instrumentation system with which this invention may be used. This particular system is comprised of a function generator 2, an oscilloscope 4 and a universal counter 6. The output of the function generator 2 is coupled to the inputs of the oscilloscope 4 and the universal counter 6. Communication between these instruments and a computer 8 is via a communication bus 10 and interface electronics 12. The computer 8 is controlled by a keyboard 14 and graphical displays are formed on a cathode ray tube 16. If desired, a mouse 18 is coupled to the computer 8 so as to control the position of a cursor on the screen of the cathode ray tube 16.

Before going into an explanation of the operation of the system, reference is made to FIG. 1 for a description of the general format of one presentation that may appear on the CRT 16. In a column at the left are a plurality of what are referred to herein as system view windows, SVWs, that respectively show the identification and certain data related to each of several different instruments. In this illustration, the top SVW 20 is for the function generator 2 that is filled with half-tone for reasons to be explained, an SVW 22 for the oscilloscope 4, and an SVW 24 for the universal counter 6. What will be termed an interactive instrument window, referred to herein as an IIW, 26 occupies most of the rest of the screen. In addition to a label of instrument type and and identification, it contains a plurality of components for controlling the function generator 2. The SVW 20 for the instrument having components in the IIW is half-toned because there is no need to repeat information that is available in the IIW 26. When the control components for another instrument are presented in the IIW, its SVW is half-toned and the information for the instrument that was in the IIW is shown in its SVW.

The control components will, of course, be different for each instrument; but the control components for the function generator 2 are a ganged switch 28 for selecting whether the output of the generator is to be a sine wave, a triangular wave or a square wave; numeric entry components 32, 34, 36 and 38 for frequency, amplitude, offset and symmetry; a ganged switch 40 for selecting the mode of operation, i.e., whether it is to be continuous, gated or burst; and a toggle switch 42 for the output. Also on the screen will be a STATUS line and various softkeys that are not part of this invention. As an aid to the user, the active part of most components contains characters on a shaded background, and the inactive parts contain characters on a white background. In the particular situation illustrated in FIG. 1, the function generator 2 is outputting a continuous sine wave at 1.0 KHz having an amplitude of one volt, a zero volt offset and 50% symmetry, and its output is enabled.

An advantage of this invention is that the effects of the output of the instrument represented in the IIW on other instruments to which it is coupled appear in the appropriate system view windows. Thus, a continuous sine wave having the selected amplitude, offset and symmetry appears in the SVW 22 for the oscilloscope and the selected frequency of 1.00 KHz is Printed in the SVW 24 for the universal counter 6.

Another advantage of the invention is that only those control components of an instrument that are needed for performing a selected function appear in the IIW. In FIG. 1, the wave provided by the function generator 2 is continuous; but in FIG. 9, the function NBURST is activated and three other controls that only relate to burst mode, such as start, halt, and the number of pulses to be output appear. If they were present all the time, it would be confusing. A more dramatic situation is an oscilloscope. Those skilled in the art are aware of the fact that there are so many controls on the front panel of a conventional oscilloscope that it is sometimes difficult to select the proper controls and easy to make mistakes because there are so many of them. FIG. 12 shows an IIW of this invention when it contains the controls for an oscilloscope. For each of the control components of each major section of an oscilloscope, such as Vertical Amplifiers for each channel, the time base, and the triggering circuitry, a different set of related controls appears in the right-hand side of the IIW.

Although the algorithms for operating an instrument system containing this invention is fully explained infra, a brief summary is set forth below.

```
    BEGIN
1   [ identify instruments on bus ]
2   [ set all instruments to power-on state ]
3   [ build the Instrument List ]
4   [ build the Window List ]
5   [ assign 1st instrument found on bus to the IIW ]
6   [ draw the IIW ]
7   [ draw each SVW ]
8   [ enable user input devices (mouse and keyboard) ]
9   WHILE (the user has not selected the "Exit" softkey) DO
    BEGIN
10      [ poll instruments for "data ready" ]
        IF ("data ready") THEN
        BEGIN
11          [ execute service routine for the instrument ]
12          IF (instrument is in IIW) THEN [ update the IIW ]
12          IF (instrument is in a SVW) THEN [ update that SVW ]
        END
13      [ check for user input ]
14      IF (user made a selection) THEN
        BEGIN
15          [ identify window selected ]
            CASE (window) OF
            IIW: BEGIN
16              [ identify component selected ]
17              IF (no component selected) THEN [ beep ]
                ELSE
                BEGIN
18                  [ execute instrument control command
                      associated with user request ]
19                  [ update the IIW ]
                END
            END
            SVW: BEGIN
20              [ erase the IIW ]
21              [ update SVW for instrument just in IIW ]
22              [ draw the IIW for instrument whose SVW was
                  selected ]
23              [ half-tone the SVW for instrument which was
                  selected]
                END
24          OTHERWISE [ beep ]
            END
        END
        IF (softkey selected) THEN
25          [ execute system function associated with softkey ]
        END
    END
```

BRIEF DESCRIPTION OF THE DRAWINGS

FIG. 6 illustrates the SVW component template for an oscilloscope;

FIG. 7 illustrates the SVW component template for a universal counter;

DETAILED DESCRIPTION OF THE INVENTION

Representation of Instruments on the Computer Display

There are two specific representations of any electronic instrument that can appear on the computer display. One is a full "front panel" representation of the instrument which appears in this particular implementation in the upper right area of the display and which occupies most of the available space. It is from this representation that the operator can interact with the various graphical components to control the instrument which is pictured. The area of the display in which this representation of the instrument appears is called the "Interactive Instrument Window", or IIW.

The second representation of the instrument is one which does not provide any controls, but instead shows a summary of the instrument's status. The status includes continually updated readings in the case of measurement instruments such as multimeters, universal counters, and oscilloscopes. Each instrument in the system shows this representation in an area referred to as its "System View Window", or SVW. A SVW for each instrument attached to the interface bus appears in a column along the left edge of the computer display in the program described herein. If more instruments exist in the system than will fit along the left edge of the display, the computer's softkeys may be used to scroll the SVWs up and down on the screen.

Although the operator cannot control an instrument from its SVW, he can point to and select a SVW. This has the effect of putting the instrument currently in the IIW back into its SVW, and bringing the newly selected instrument up into the IIW.

Figure 1:
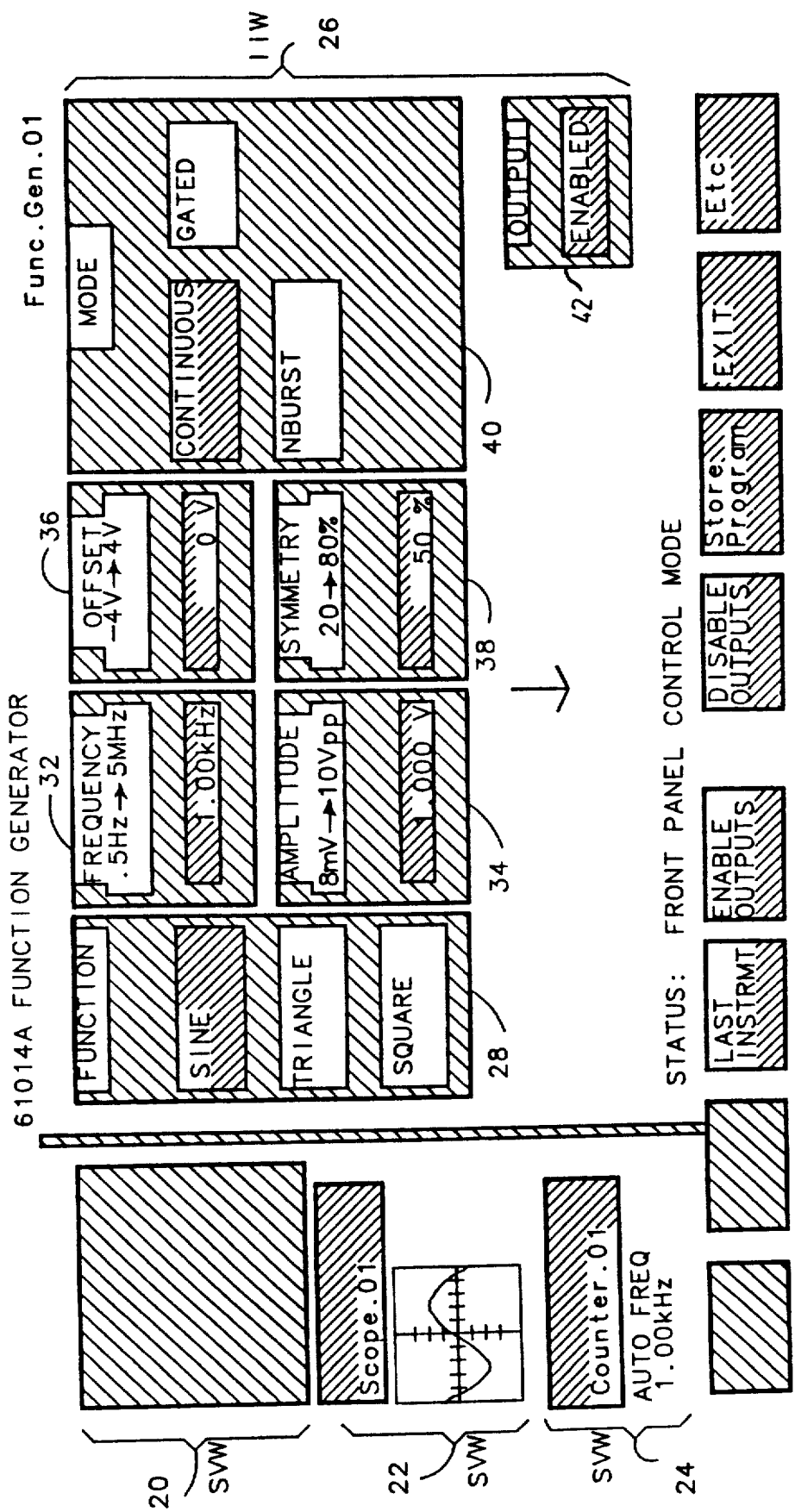
FIG. 1 illustrates the appearance of the CRT of the system when a function generator is displayed in the interactive instrument window, IIW.

The IIW and SVWs are marked on the computer display shown in FIG. 1.

GRAPHICAL COMPONENTS

The graphical components which comprise each of these windows were designed to closely resemble their physical counterparts. Graphical components have been implemented to represent the types of physical controls and indicators shown below:

Ganged Switch: A control which is a "1 of N" selector, usually consisting of a number of pushbuttons connected together mechanically so that only one may be selected at any time; selecting a new member of the gang de-selects the previous one.

Rotary Switch: Similar to a Ganged Switch in that it is a component which is a "1 of N" selector, it consists of a knob with multiple stops or detents in its rotary action. It is usually used to select from a group of settings which are ordered numerically.

Toggle Switch: A control that is a "1 of 2" selector, usually with a lever that is placed in either an up or down position.

Momentary Contact Switch: A control switch used to provide a signal to trigger or initiate an action. It is usually a pushbutton which returns to its original position when released.

Numeric Entry Field: A combination control and indicator for relatively or absolutely specifying a numeric value. It may consist in hardware either as a keypad tied to an LED or LCD display (absolute) or as a series of momentary contact switches which are used to increment or decrement an existing value (relative).

Alphanumeric Entry Field: A combination control and indicator for entering text strings. It consists in hardware as a keyboard with buttons from which characters may be specified.

LCD Array: An indicator to display numbers. In hardware, it is either an array of 7-segment LEDs or LCDs.

Text Display Field: An indicator to display text strings. In hardware, it is often an array of 16-segment LEDs or LCDs, or 5×7 dot (or greater) LED or LCD cells.

CRT Screen: A two-dimensional display that graphically displays one parameter versus another (voltage vs. frequency, voltage vs. time, etc.). In hardware, it is usually a cathode ray tube display built into an instrument.

Labels: An indicator that displays a fixed alphanumeric string. Its hardware analogy is a silk-screened label on an instrument's front panel.

Figure 2:
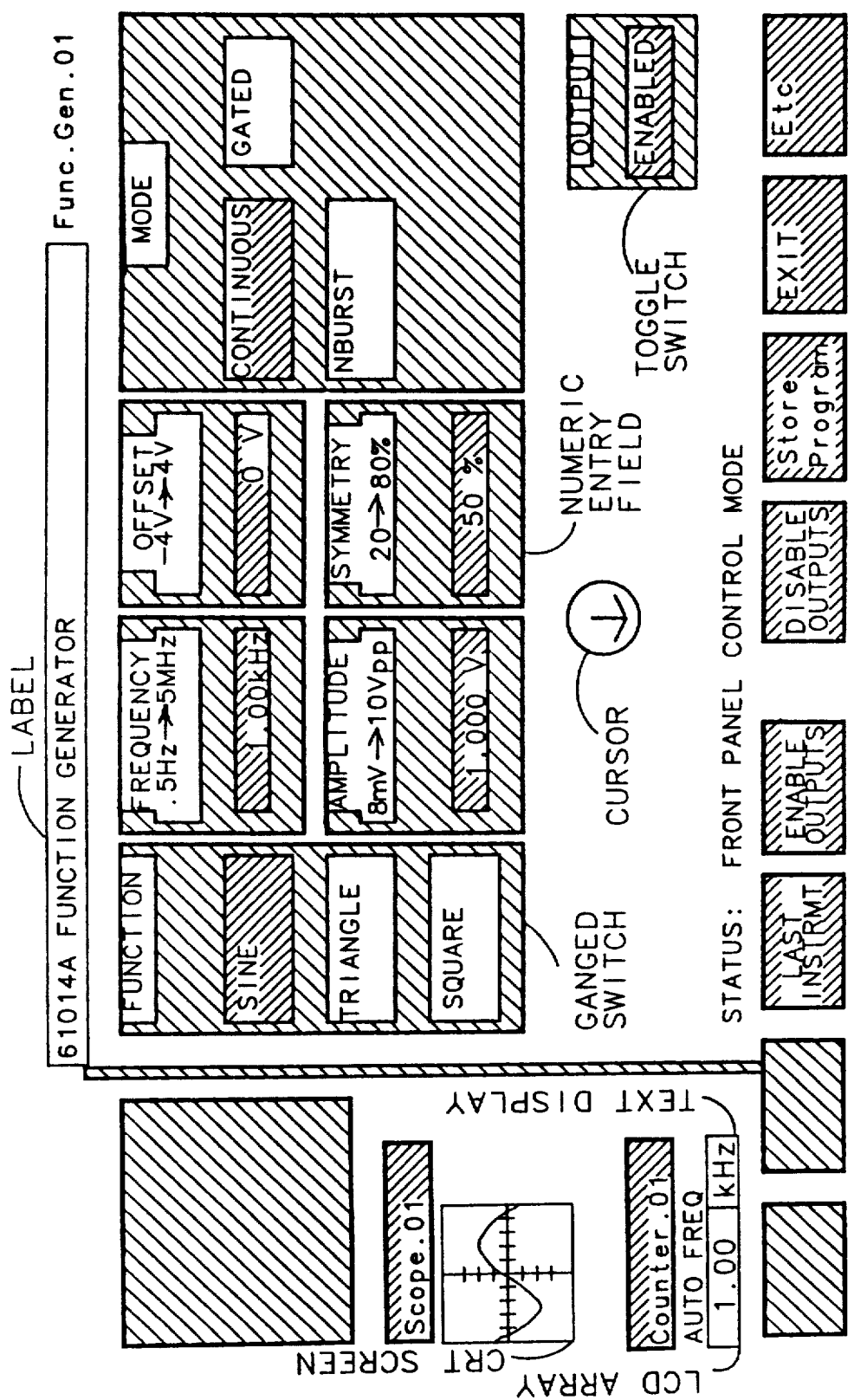
FIG. 2 is like FIG. 1 and identifies the various control components.

FIG. 2 shows the computer display marked up to indicate the various types of components which go into implementing the instruments in the example. Note that not all of them appear in this example.

Also present on the computer display in this method, but not part of the patent claim, are the computer's softkeys and a status area to display error information and prompts to the user.

INTERNAL DESIGN OF THE IMPLEMENTATION

To understand the operation of the algorithm of the method, it is necessary to first describe some of the major aspects of the internal design of the implementation described herein.

Drawing Graphics on the Computer Display

In order for the method to work, it needs the ability to draw the various components and windows on the screen. This means interacting with the particular hardware-dependent display mechanisms of the computer.

The implementation used here assumes the availability of a graphics display mode with at least 512 pixels horizontally and 200 pixels vertically. The display is then divided into 25 rows of 80 columns each, or 2000 "cells".

Figure 3:
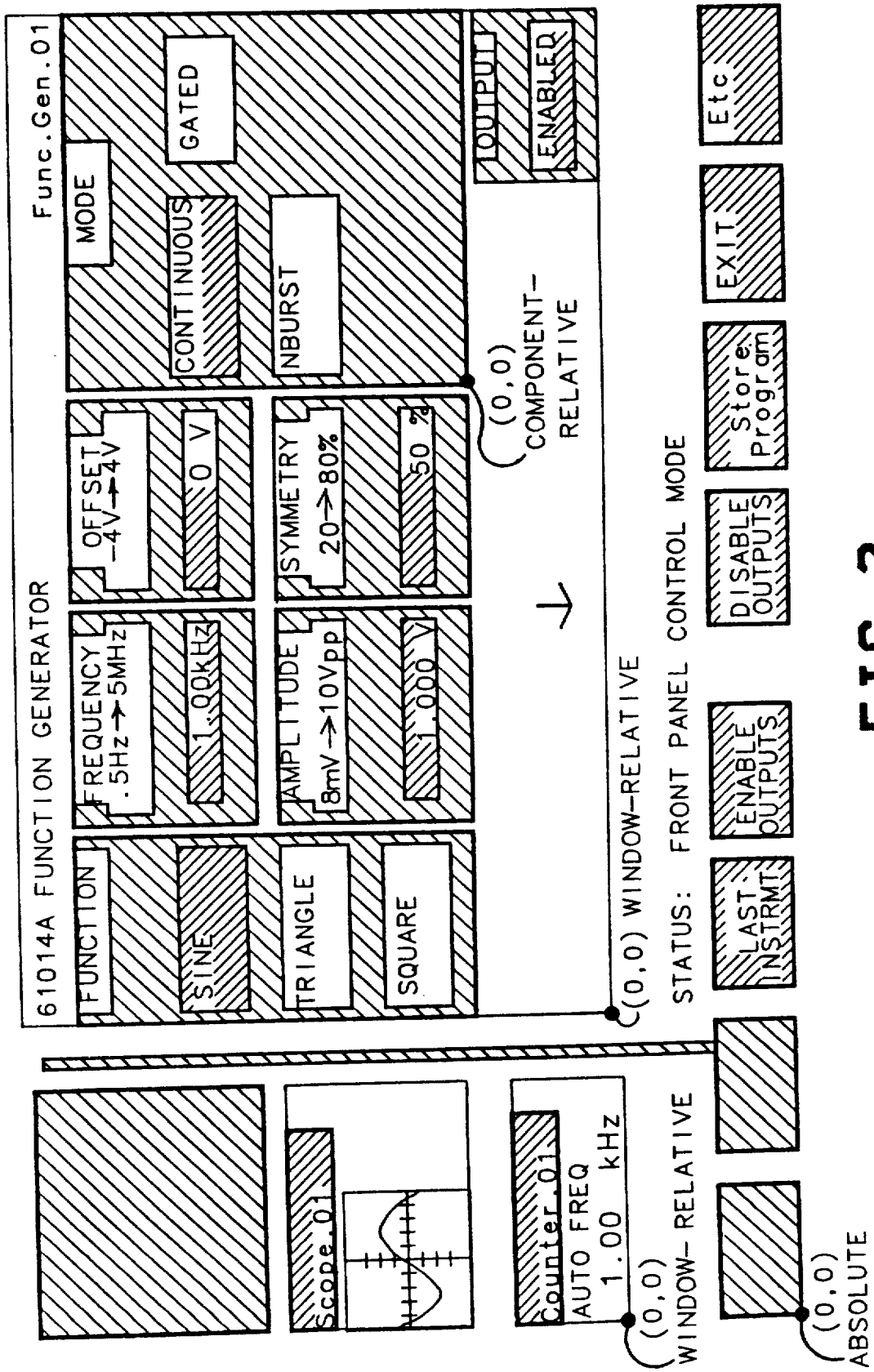
FIG. 3 is like FIG. 1 and identifies the coordinate locations of several windows.

There are three major coordinate systems used in the method: absolute, window-relative, and component-relative. They are shown in FIG. 3. Note that the (0,0) origin for each system is at the lower left. A few routines called "graphical primitives" handle the very lowest level of graphics, that of writing basic graphical elements to the graphics plane. They all use standard algorithms documented in computer graphics literature. These routines are:

(a) drawing a line;
(b) drawing a dot;
(c) writing a character (via "bitblt"s);
(d) filling a rectangular box;
(e) specifying a pen color for drawing, writing, and filling;
(f) specifying a line type for line drawing;
(g) specifying a fill pattern for box filling; and
(h) specifying a writing mode: black-on-white or white-on-black.

For drawing graphical components, each component type has a draw routine which sequences calls to the graphical primitives to display the component in the desired appearance.

Erasing a component is a much simpler operation: the pen color is set to white, and a box corresponding to the location and size of the component is filled, which makes the component disappear.

A few routines called "graphical primitives" handle the very lowest level of graphics, that of writing basic graphical elements to the graphics plane. They all use standard algorithms

Major Software Data Structures

The major data structures used in the system are linked lists. There are three types which are important for understanding the implementation:

(a) Instrument List:

Each entry in the list represents one of the electronic instruments connected to the computer via the interface bus. The fields of each entry contain, or point to, information necessary to display or control the instrument.

(b) Window List:

Each entry in the list represents either the IIW (one per system) or one of the SVWs (one per instrument) used to display the instrument representations on the computer display. The fields of each entry contain, or point to, information necessary to display each window.

(c) Component Templates:

Two component templates exist for each type of instrument supported by the system. One defines the components in the instrument's IIW representation, and the other defines the components in its SVW representation. Each entry in a template contains the information necessary to display a component on the screen and indicate the I/O action associated with it.

Types (a) and (b) are dynamic data structures built when program execution begins.

The linked lists of type (c) are static data structures associated with each type of electronic instrument supported.

Instrument List

The instrument list contains information about each of the instruments which are connected to the computer via the interface bus.

Each instrument data structure has the following fields:

```
+-----------------------------+
|                             |
|              v              |
+-----------------------------+
|   Instrument Type           |
+-----------------------------+
|   Name String               |
+-----------------------------+
|   IIW Component Template pointer |
+-----------------------------+
|   Physical Address Info     |
+-----------------------------+
|   SVW Window Pointer        |
+-----------------------------+
|   State Info Block Pointer  |
+-----------------------------+
|   Pointer to Next Instrument|
+-----------------------------+
```

```
+---------------------+
"                     "
"                     "
         v
+---------------------+
"                     "
```

As can be seen from the diagram, some of the information in this structure pertains to the type of instrument (i.e., a certain model of function generator), and some of it pertains to the particular instance (occurrence in the system) of that type of instrument (i.e., a function generator connected to the interface bus at a certain address, and set to a certain state).

These fields are defined as follows:

Instrument Type: A code which represents the type of instrument; for example, a particular model of function generator.

Name String: A string of characters which is displayed in both the IIW and SVW to identify the instance of a particular instrument model (since more than one instrument of the same type can be connected to the computer's interface bus).

IIW Component: A pointer to the start of the IIW component template for this type of instrument.

Physical Address Info: A block of information (shown here as a single field, since it is specific to the hardware architecture of the computer and interface) which contains all the required addressing information for the interface bus driver to communicate with this particular instance of the instrument type.

SVW Window Pointer: A pointer to the SVW-type entry in the window list which is used to display the instrument's SVW representation.

State Info Block Pointer: A pointer to a block of memory which contains fields to completely specify the state of this particular instance of this type of instrument. Since the size and definition of a State Info Block is specific to the instrument type, the instrument list contains a pointer to the block, and not the block itself.

Next Instrument Pointer: A pointer to the entry for the next instrument in the list; it is the link.

Window List

The window list locates and is used to display a window on the computer display. Each window data structure contains the following fields:

```
"                     "
"                     "
+---------------------+
         "
         "
         v
```

```
-continued
+---------------------+
"  (x,y) Window Origin     " absolute coordinates
+---------------------+
"  (dx,dy) Window Size     "
+---------------------+
"  Window Type             "
+---------------------+
"  Component Template pointer  "
+---------------------+
"  Instrument Info Pointer     "
+---------------------+
UHL$REEXAMINATION 10000000 19999999 1---------+
         "
         v
+---------------------+
"                     "
```

These fields are defined as follows:

Window Origin: Absolute (x,y) coordinates which locate the origin (lower-left) of the window with respect to the lower left corner of the display.

Window Size: The type of window the structure represents, either the IIW or one of the SVWs.

Component Template Pointer: A pointer to the component template associated with this window; it is fixed for each SVW entry in the window list, but changes for the IIW entry based on the type of instrument which is currently represented in the IIW.

Instrument Info Pointer: Points to the entry in the instrument list which is represented by the window.

Next Window Pointer: A pointer to the entry for the next window in the list; it is the link.

Component Templates

A component template is a "form" for displaying information about the state of an instrument in a particular representation on the computer display. Each instrument type has two templates associated with it, one for its IIW representation and one for its SVW representation.

One copy of these templates serves every instrument of that type in the system. Each instrument, however, can be set to a different state, which gets reflected in the appearance of the component.

For example, the ganged switch component of the function generator in FIG. 1 has three buttons: Sine, Square, or Triangle. The button which will appear as a black background with white characters to indicate the current function of the instrument depends on the State Information Block for "Func.Gen.01". Similarly, the Numeric Entry Field that represents frequency displays an ASCII string, "1.00 kHz" corresponding to the current frequency setting of this function generator.

Each component included in the component template has at least one structure, and perhaps two, associated with it. The fields of these structures are as follows:

```
"                     "        "                     "
+---------------------+
         "
         "          COMPONENT STRUCTURE
         v
```

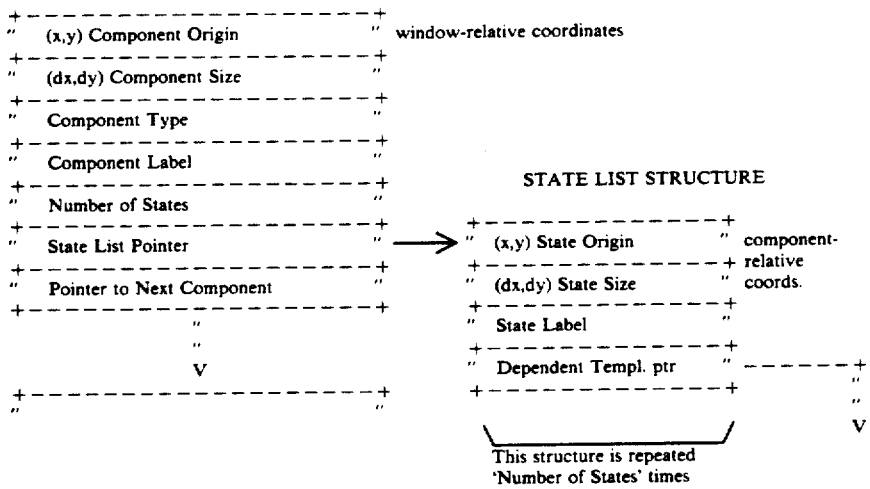

The fields in the Component Structure are defined as follows:

Component Origin: Window-relative (x,y) coordinates which locate the origin (lower-left) of the component with respect to the lower left corner of the window within which it resides.

Component Size: (dx,dy) coordinates which specify the size of the component in cells.

Component Type: The type of component the structure represents.

Component Label: A string of ASCII characters which is the label associated with the overall component.

Number of States: For those components which have discrete states associated with them (ganged switches, rotary switches and toggle switches), this is a positive number indicating how many states there are. For components that display varying values (Numeric Entry, Alphanumeric Entry, LCD Array, Text Display, and CRT), the number of states equals "1". For labels, this field equals "0".

State List Pointer: If the number of states is positive, this field will point to the start of the associated state list structure for the component. If the number of states equals "0", this field equals "NIL".

Next Component Pointer: A pointer to the component structure of the next component in the template, it is the major link in the template.

If a state list exists, it will consist of the base structure shown above replicated as many times as there are states. The fields in the state list structure are defined as follows:

State Origin: Component-relative (x,y) coordinates which locate the origin (lower-left) of the state button or entry/display field with respect to the lower left corner of the component within which it resides.

State Size: (dx,dy) coordinates which specify the size of the state button or entry/display field in cells.

State Label: A string of ASCII characters which is the label associated with a state button.

Dependent Template Pointer: A pointer to the first component structure of a dependent component template. The components in the dependent template will be drawn only when the controlling component is in the state associated with the dependent template pointer. Dependent templates are only associated with components that have discrete states (ganged, rotary, and toggle switches). It is these components, then, through which the invention solves the "overdensity" problem of front panel controls

High-Level Window Graphics

The low-level mechanics of drawing graphical images on the screen was covered previously. Now that an explanation of the major data structures has been presented, the high-level routines which analyze the templates, obtain state information, and orchestrate the low-level graphics can be explained.

The key software routine is known as the "Update Window" routine. It has four modes which operate on windows: it can CREATE, MODIFY, HALF-TONE, or ERASE them. A fifth mode, COMPONENT ERASE, is for its own internal use.

A window will be created when it is being drawn in its current location for the first time. If the window is already visible in its current position on the screen and it merely needs to be updated to reflect a state change in the instrument it represents, then it is modified. If an instrument is going from the IIW back to its SVW, the IIW will be erased. If an instrument is going from the SVW to the IIW, its SVW will be half-toned.

The "Update Window" routine is given a pointer to the window data structure in the window list for the window it will be operating on, and the mode parameter. The operation of each mode is explained below:

(A) mode=ERASE or HALF-TONE

This is the simplest mode of operation:
(1) Obtain "Window Origin" and "Window Size" from pointer to window list entry which is passed as a parameter.
(2) Set the n to white or half-tone.
(3) Box-fill primitive the entire area of the window with the selected fill pattern.

(B) mode=CREATE

This mode involves walking the component template, getting information about the state of each component, and drawing each component on the display:
(1) Obtain "Window Origin" from pointer to window list entry which is passed as a parameter.

(2) Use "Instrument Info Pointer" to obtain the "State Info Block Pointer" for the instrument represented within the window.

(3) Use "Component Template Pointer" to access the first component in the component template.

(4) Add "Component Origin" coordinates to "Window Origin" components to obtain absolute display location.

(5) Use calculated absolute coordinates and "Component Size" to fill a box the size of the component with a half-tone pattern.

(6) Write out the "Component Label" string starting at (absolute x, absolute y+dy) in "black-on-white" mode.

(7) Pass "Component Number" and "State Info Block Pointer" to the "State Inquiry" conversion routine for the particular type of instrument. This routine translates the relevant information in the State Info Block into the current state format for the type of component. These formats are:
  a) State Number: Used by ganged, rotary, toggle, and momentary switches; it is a number which is used to index into the state list structure of the component.
  b) State String: Used by Numeric Entry, Alphanumeric Entry, Text Display, and LCD components; it is a pointer to the string to be displayed as the component's state.
  c) State Array: Used by the CRT component; it is a pointer to an array of data which gets scaled to fit the size of the CRT and displayed as dots on the computer display.

(8) Display the state information within the "frame" of the component already drawn using "State Origin" and "State Size" (component-specific algorithm).

(9) If the component currently being created has discrete states, index to the entry in the state list for the specified state. If "Dependent Template Pointer" is non-NIL, call the "Update Window" routine recursively at this time using "Dependent Template Pointer", and mode=CREATE. The recursive call begins with step (4) and returns here when complete.

(10) If "Next Component Pointer" is not "NIL", traverse the list to the next component and go to step (5).

(11) If "Next Component Pointer" equals "NIL", the routine is complete.

(C) mode=MODIFY

This mode is designed for speed of updating an instrument's representation. Only changes in state, not the entire window, are redrawn. It involves walking the component template as in the "create" mode, but with two major differences: if the state of a component has not changed since the last time it was updated, nothing is done. And if the state of a component with discrete states, the previous "Dependent Template" must be erased, and the new "Dependent Template" created:

(1) Obtain "Window Origin" from pointer to window list entry which is passed as a parameter.

(2) Use "Instrument Info Pointer" to obtain the State Info Block Pointer" for the instrument represented within the window.

(3) Use "Component Template Pointer" to access the first component in the component template.

(4) Add "Component Origin" coordinates to "Window Origin" components to obtain absolute display location.

(5) Pass "Component Number" and "State Info Block Pointer" to the "State Inquiry" conversion routine for the particular type of instrument. In addition to current state, a second parameter is returned for the various classes of components, as follows:
  a) State Number: In addition to current state number, it also returns previous state number: the state number given back the last time "State Inquiry" was called for that component.
  b) State String: In addition to the pointer to the state text string, it also returns a flag which indicates whether or not the string has been modified since the last time "State Inquiry" was called for that component.
  c) State Array: In addition to the pointer to the state array, it also returns a flag which indicates whether or not the array has been modified since the last time "State Inquiry" was called for that component.

(6) Overwrite the old state information with the new state information ONLY if the state of the component has changed since the last "State Inquiry" operation (component-specific).

(7) If the component has discrete states, index to the entry in the state list for the previous state. If its "Dependent Template Pointer" is non-NIL, call the "Update Window" routine recursively at this time, with "Dependent Template Pointer" and mode=COMPONENT ERASE. When this process completes, index to the state list entry of the new state. If "Dependent Template Pointer" is non-NIL, call the "Update Window" routine recursively again, using "Dependent Template Pointer" and mode=CREATE.

(8) If "Next Component Pointer" is not "NIL", traverse the list to the next component and go to step (5).

(9) If "Next Component Pointer" equals "NIL", the routine is complete.

(D) mode=COMPONENT ERASE

This mode is only invoked from within the MODIFY mode:

(1) Use "Dependent Template Pointer" to access the first component in the dependent component template.

(2) Add "Component Origin" coordinates to "Window Origin" components to obtain absolute display location.

(3) Use calculated absolute coordinates and "Component Size" to fill a box the size of the component with a white pattern.

(4) If the component has discrete states, pass "Component Number" and "State Info Block Pointer" to the "State Inquiry" conversion routine for the particular type of instrument in order to obtain the current state. Index to the entry in the state list for the current state. If "Dependent Template Pointer" is non-NIL, call the "Update Window" routine recursively at this time, with "Dependent Template Pointer", and mode=COMPONENT ERASE.

(5) If "Next Component Pointer" is not "NIL", traverse the list to the next component and go to step (3).

(6) If "Next Component Pointer" equals "NIL", the routine is complete.

EXPLANATION OF THE ALGORITHM BY EXAMPLE

Now that the framework has been laid, consider a specific example which illustrates the algorithm of the computer program which implements the system explained above.

Figure 4:
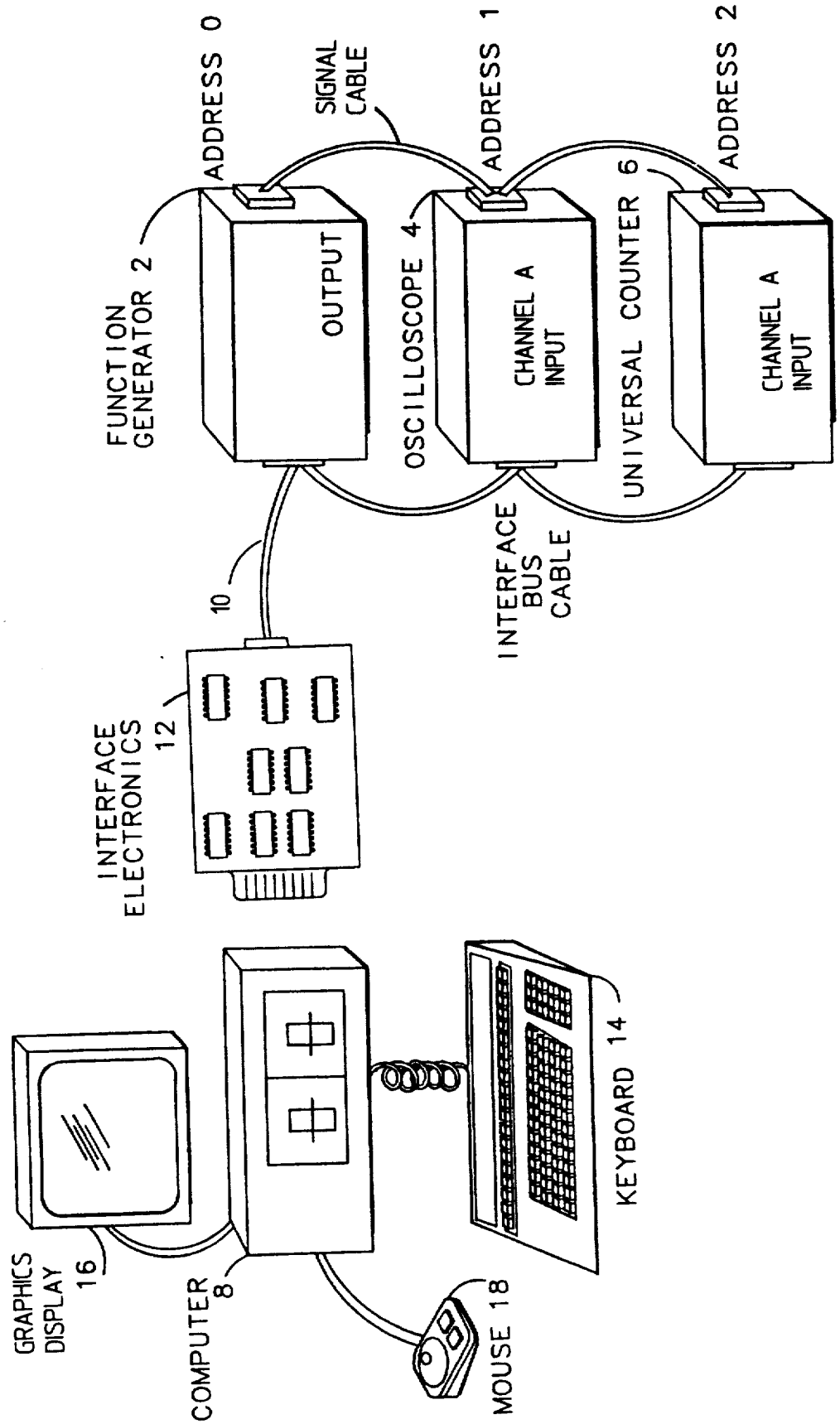
FIG. 4 illustrates an instrument system that may incorporate this invention.

The system hardware configuration that will be used in describing the method is shown in FIG. 4. It consists of a computer with a graphics display keyboard and a mouse, three computer-programmable instruments (a function generator, an oscilloscope, and a universal counter), and an interface electronics card and bus cable which connect the instruments to the computer for control purposes. The output signal of the function generator is connected to the input channels of both the oscilloscope and universal counter to illustrate the stimulus/response nature of these instruments. The computer is executing a software program which implements the interactive graphics control invention described in this document.

The algorithm of the computer program which implements the interactive graphics to control these instruments has been set forth previously as part of the "Brief Summary of the Invention".

The notation used in the algorithm is that of a structured programming language. Each statement in brackets ([]) is a major operation performed by the program. Control logic keywords are shown in CAPS.

Figure 5A:
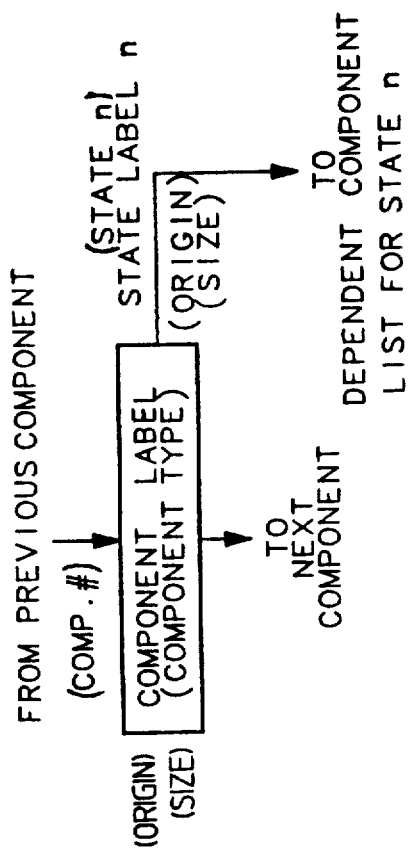
FIG. 5A is a legend for FIG. 5.
Figure 5B:
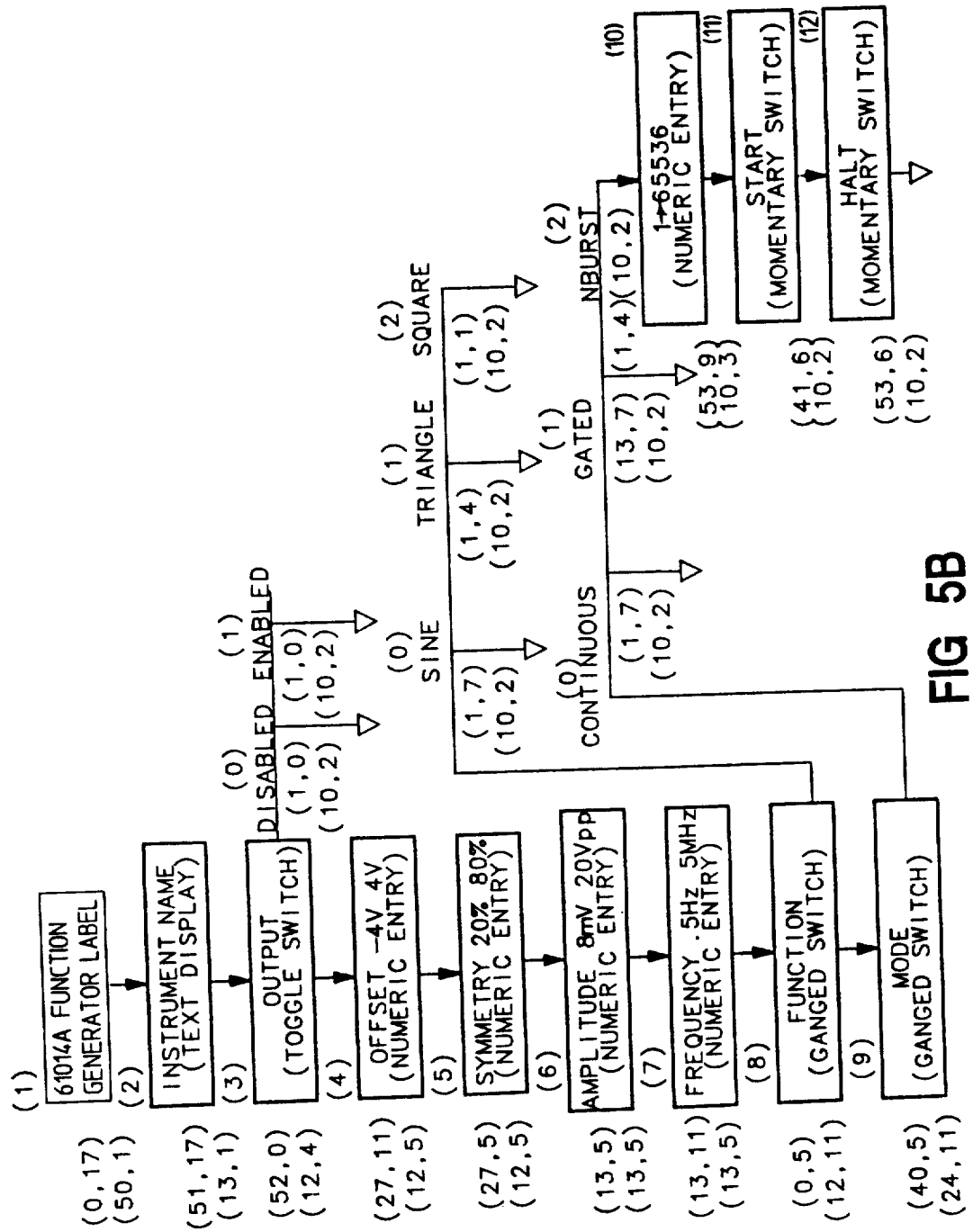
FIG. 5B illustrates an IIW component template for a function generator.

A graphical representation of the component templates used in this example are supplied, to facilitate understanding of how the "Update Window" routine operates. They are:

FIG. 5B: Function Generator IIW
FIG. 6: Scope SVW
FIG. 7: Universal Counter SVW

Each of the major operations of the algorithm as briefly outlined in the Brief Summary of the Invention will now be explained.

(1) [identify instruments on bus]

This process is hardware-dependent. For the computer and interface on which the invention has been implemented, there are a finite number of available bus addresses, and sending a READ SELF-ID command to each of these addresses results either in an instrument returning a message identifying its type, or the bus operation timing out, which indicates that no instrument exists at this address. Each legal address is tested, and a table is built listing address and corresponding instrument type.

For the hardware configuration of FIG. 4, the following table will be built:

| Address | Instrument Type |
|---------|-----------------|
| 0 | Function Generator |
| 1 | Oscilloscope |
| 2 | Universal Counter |

(2) [set all instruments to power-on state]

Each instrument in the previous table is sent a "power-on" command over the interface bus, to put it into a known, initial state. This is in preparation for building the instrument data structures, whose State Info Blocks must reflect the current state of the instrument.

(3) [build the Instrument List]

For each instrument, space for the Instrument data structure and State Info Block is NEWed from the memory heap. All fields except the "SVW Window Pointer" are filled in (that one will be back-filled in the next step). Routines specific to the particular instrument type are called to fill in the State Info Block. This process continues until the table from step (1) is traversed.

The "Next Instrument Pointer" field of the last instrument in the list is set to point to the first instrument in the list, making the instrument list circular.

A pointer variable, "Next Polled Instrument", is initialized to point to the first instrument in the list.

(4) [build the window list]

Figure 8:
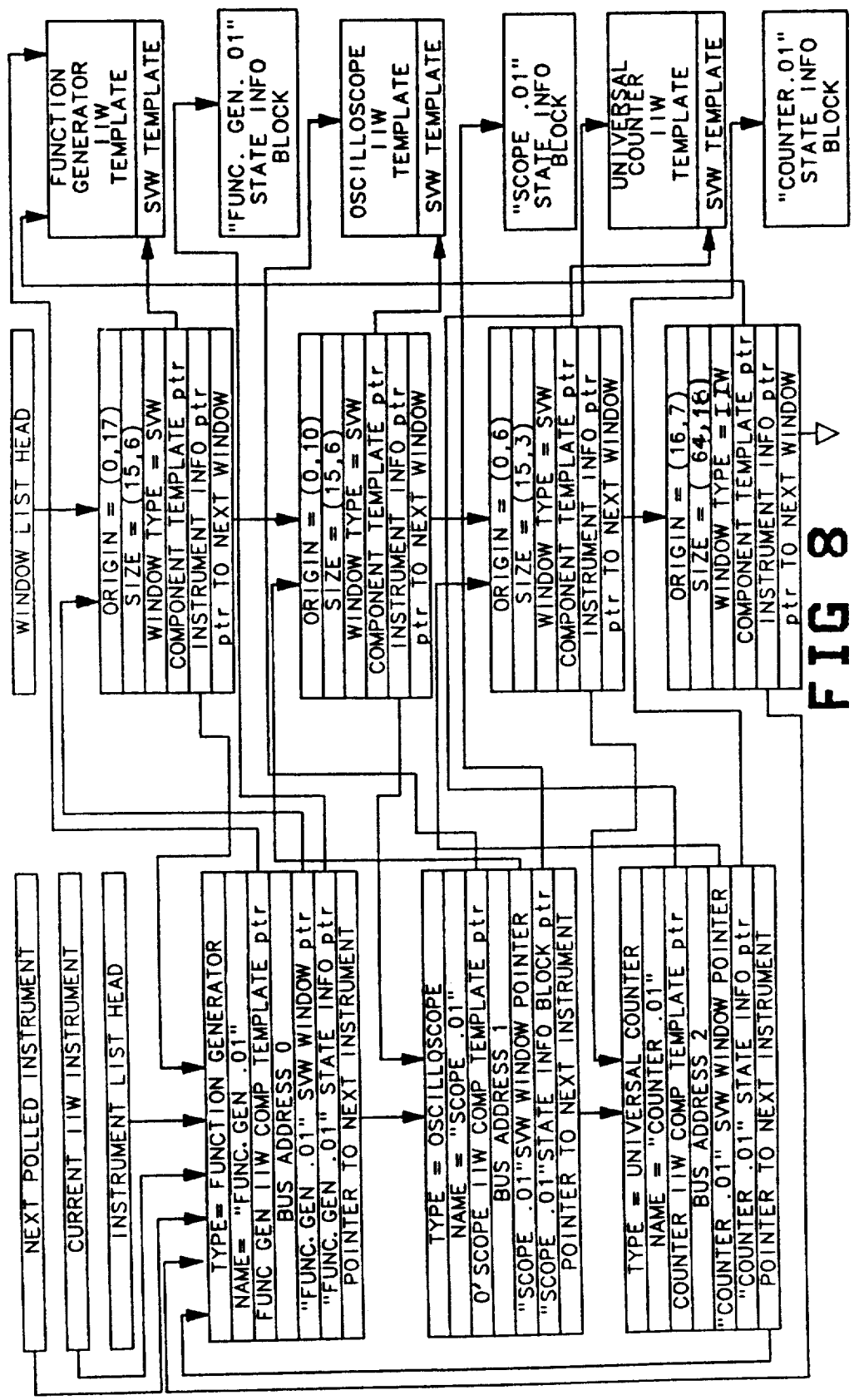
FIG. 8 is an instrument list and window list for the example system of FIG. 4.

The window list is built by walking down the instrument list, NEWing and filling in a window data structure (of "Window Type"=SVW) for each instrument. The "x" Window Origin and "dx" Window Size coordinates are fixed at 0 and 15, respectively in this implementation, so that the various SVWs will all appear in a column on the left of the display. The "Instrument Type" field of the instrument is used to obtain a pointer to the SVW template which is filled into the "Component Template Pointer" field. The "dy" Window Size coordinate also depends on instrument type, and it is obtained by traversing the SVW template and finding the component with the maximum "y"+"dy" coordinates. The "y" field is adjusted, based on "dy", so that the SVWs will start at the top of the display and build down, as shown in FIG. 8. The "Instrument Info Pointer" field is set to point back to the entry in the instrument list that the window represents.

When a SVW window has been built for every entry in the instrument list, the IIW window is then NEWed. The "(x,y) Window Origin" and "(dx,dy) Window Size" fields of the IIW are fixed at (16,7) and (64,18) in this implementation, based on its location in the upper right of the display. "Window Type" is set to IIW. This is the end of the list, so the "Next Window" pointer is "NIL". The other two pointer fields of the IIW window list entry are left blank for the moment.

(5) [assign first instrument in instrument list to the IIW]

The "Component Template Pointer" field of the IIW window is filled in with the "IIW Component Template Pointer" field of the first instrument in the instrument list. The "Instrument Info Pointer" is set to point to the first instrument structure in the instrument list.

A separate pointer variable, "Current IIW Instrument Pointer" is also set to point to the first instrument structure in the instrument list.

FIG. 8 shows the completed instrument list, window list, and other important variables as they would exist for the example system at this time.

(6) [draw the IIW]

At the present time, assume the display is blank. Since the IIW representation has to be redrawn completely, the "Create Window" routine is used.

In preparation for drawing the IIW, the window list is walked until the window where "Window Type"=IIW is found. The "Update Window" routine is supplied the pointer to that window and called with mode=CREATE.

Drawing of components begins with the top component in the component template shown in FIG. 5B. The power-up state of the function generator results in "State Inquiry" for the components yielding the following results:

| Component | State |
|---|---|
| 1 | ("Label" components have no state) |
| 2 | "Func.Gen.01" |
| 3 | State 1 (enabled) |
| 4 | "0 V" |
| 5 | "50%" |
| 6 | "1.000 V" |
| 7 | "1.00 kHz" |
| 8 | State 0 (sine) |
| 9 | State 0 (continuous) |

Component State

FIG. 1 shows what the function generator's IIW will look like when the "Update Window" routine is completed.

(7) [draw each SVW]

The same process as performed in the previous step is done again, this time for each individual entry in the window list which has Window Type="SVW". As the window list is walked, the "Instrument Info Pointer" field of each window entry is compared against the "Current IIW Instrument Pointer" to see whether or not that window is the SVW for the instrument which is currently in the IIW. "Update Window" for the SVW for that instrument is called with mode=HALFTONE. "Update Window" for all other SVWs is called with mode=CREATE.

Since the first SVW in the window list belongs to the function generator, it is the one which is half-toned.

The succeeding two SVWs, for the oscilloscope and the function generator, do get created.

At this point, the computer display should look just as in FIG. 1.

(8) [enable user input devices (mouse and keyboard)]

Now that initialization is complete, the proper commands to enable movement of the mouse and entries from the keyboard are sent to those devices. Until this point, the operator could not interact with the system.

Before operator inputs are enabled, the cursor is placed onto the display at a known, fixed position, so that its position can be tracked by the computer program.

(9) WHILE (the user has not selected the "Exit" softkey) DO

The loop which begins with this statement has two main functions:

(a) To check and see if any instrument are requesting service; that is, do any instruments have new state information to be displayed in the IIW or in an SVW;

(b) To respond to user inputs from the house or keyboard, and perform the instrumentation operations which the operator specifies, updating the IIW and/or SVW following the operation to reflect the change in instrument state.

The loop will continue until the operator selects the "Exit" softkey. When this softkey is pressed, the computer program implementing the invention will be terminated.

(10) [poll instruments for "service request"]

The poll routine walks the instrument list, using the "Physical Address Info" of each entry to send a command over the bus to each instrument, inquiring whether or not it is currently requesting service. It begins doing this for the instrument whose data structure is pointed to by the "Next Polled Instrument" variable. Polling continues until either a service request is detected, or the list is traversed back around to the first instrument polled.

If a service request occurs, the "Next Polled Instrument" pointer is set to the value of the "Next Instrument Pointer" field of the instrument requesting service, so that the instrument about to be serviced will be the last one to be checked on the next time the instruments get polled. This round-robin priority scheme assures that all instruments have an opportunity to be serviced.

(11) [execute service routine for the instrument]

If an instrument was found to be requesting service, its "Physical Address Info" and the "State Info Block" pointer are passed to the service routine for that instrument type. This routine analyzes the nature of the request, issues the appropriate commands over the bus to the instrument, and updates the State Info Block accordingly.

(12) IF (instrument is in IIW) THEN [update the IIW]

IF (instrument is in a SVW) THEN [update that SVW]

When the service routine is completed, the instrument which was serviced is checked to see if it is in the IIW; this is done by comparing the pointer to the instrument just serviced with the "Current IIW Instrument" pointer. If they match, the IIW display gets updated.

If it is not the IIW instrument, the "SVW Window Pointer" field is used to obtain "Window Origin" and "Window Size" information to determine if the SVW representation is currently on the screen. If it is, its SVW display gets updated.

The updating of the appropriate window is done by calling the "Update Window" routine with mode =MODIFY.

(13) [check for user input]

Operator inputs can take three forms:

(a) Moving the cursor around the display via rolling the mouse or use of the cursor control keys on the keyboard;

(b) selecting a graphical component to cause an operation via clicking the mouse button or pressing the keyboard RETURN key;

(c) pressing one of the keyboard softkeys.

Cursor movement is kept track of by the program, so that the current position of the cursor (in absolute coordinates) is always known when a selection is made. If the user input was of type (a), no further action is required.

(14) IF (user made a selection) THEN

If the mouse was clicked, or if the user pressed the RETURN key, then execute the operations within the BEGIN-END block.

(15) [identify window selected]

The first step in identifying the user request is to walk the window list using the absolute (x,y) coordinates of the cursor's current position to determine which window the cursor is located in. This is done by finding the window where cursor coordinates are greater than or equal to "Window Origin" and lesser than or equal to "Window Origin"+"Window Size". This check must match for both x and y coordinates.

(16) [identify component selected]

The program branches to here if the cursor was located within the IIW when the selection was made. This step executes the "identify selected component" routine. It is similar to the "update window" routine in that the component list for the IIW is traversed and state information is obtained.

The purpose of the routine is to determine if a valid component in the IIW was selected and, if so, to identify it. Not every type of component is eligible to be selected, but only those which qualify as "control" components. The control-type components are:

Ganged Switch
Rotary Switch
Toggle Switch
Momentary Contact Switch
Numeric Entry Field
Alphanumeric Entry Field The "Identify Selected Component" routine is passed the "Component Template Pointer" of the IIW window, the "State Info Block Pointer" of the instrument pointed to by the window's "Instrument Info Pointer", and the coordinates (converted to window-relative) of the selected cursor position.

This step executes the "Identify Selected Component" routine. It is similar to the "Update Window" routine in that the component list for the IIW is traversed and state information For purposes of illustration, assume that the function generator is in the IIW, and the display appears as in FIG. 1. The operator has moved the cursor into the area of the "NBURST" button (assume absolute x=58 and absolute y=17) and clicked the mouse. The resulting window-relative coordinates, achieved by subtracting the IIW "Window Origin" from the selected coordinates, are (42,10).

Components 1 and 2 of the template are skipped over because they are not control components. The "Next Component" field of component 2 points to component 3.

Component 3 is of type "Toggle". The selected cursor coordinates are checked to see if they fall into the area of this component. They do not, so the "Next Component" field is obtained, which points to Component 4.

Components 4 through 8 do not match either. The next component to be compared against is component 9.

Component 9 is of type "Ganged". The selected coordinates do fall within the limits of the component structure; window-relative selected "x" is greater than or equal to 40 and lesser than or equal to 63; and window-relative selected "y" is greater than or equal to 5 and lesser than or equal to 15. Next, the selected coordinates are adjusted by the "Window Origin" of the component to make them component-relative. Now, the state list fields are compared in an analogous manner. The "CONTINUOUS" and "GATED" buttons did not match, but the "NBURST" button did.

So "Component 9, State 2" is identified as the selection.

(17) IF (no component selected) THEN [beep]

If the complete IIW component template is searched and the selected cursor coordinates do not match those of any component, then the operator made a selection either outside of the area of any component, or on a component which is not of type "control". The beep alerts the operator to the fact that no instrumentation operation will occur as a result of that selection.

(18) [execute instrument command associated with user request]

Software for each type of instrument includes an "Execute I/O Action" routine which translates selected component number (and state, if applicable) into the appropriate command(s) to be sent to the instrument to carry out the control request made by the operator.

This routine is passed, along with selected component number and state, the "Instrument Info Pointer" of the window. It uses the "Physical Address Info" of the instrument object to communicate with the proper instrument, and updates its "State Info Block" to reflect the new state of the instrument when the I/O operation is complete.

(19) [update the IIW]

To reflect the new state of the instrument, the IIW is updated via a call to the "Update Window" routine with mode=MODIFY.

Using the example of step (16), updating begins with Component 1 of the function generator list. Since no state changes for the function generator are indicated until Component 9's state is obtained, no changes to the computer display occur until this time.

Component 9 indicates that its new state equals "2" (BURST mode), while its old state equals "0" (CONTINUOUS mode). There is no need to redraw the mode ganged switch completely; but the state button corresponding to CONTINUOUS mode is box-filled with a white pattern, with its label "CONTINUOUS" drawn with a black pen in opaque mode. The state button corresponding to BURST mode is box-filed with a black pattern, with its label "NBURST" drawn with a white pen in opaque mode.

Since a ganged switch component can have dependent component lists, these must be checked also. The old state, CONTINUOUS, has no dependent list, so there is nothing else to be erased. The new state, BURST, does have a dependent list which must be drawn. A call to the "Create Window" routine is made at this point, with the start of the dependent list as the parameter. When this list is drawn, as in step (6), the "Create Window" routine exits, and the "Modify Window" routine continues with the next component of component 9. Since component 9 is the end of the list, "Modify Window" is complete, and the update process concludes.

Figure 9:
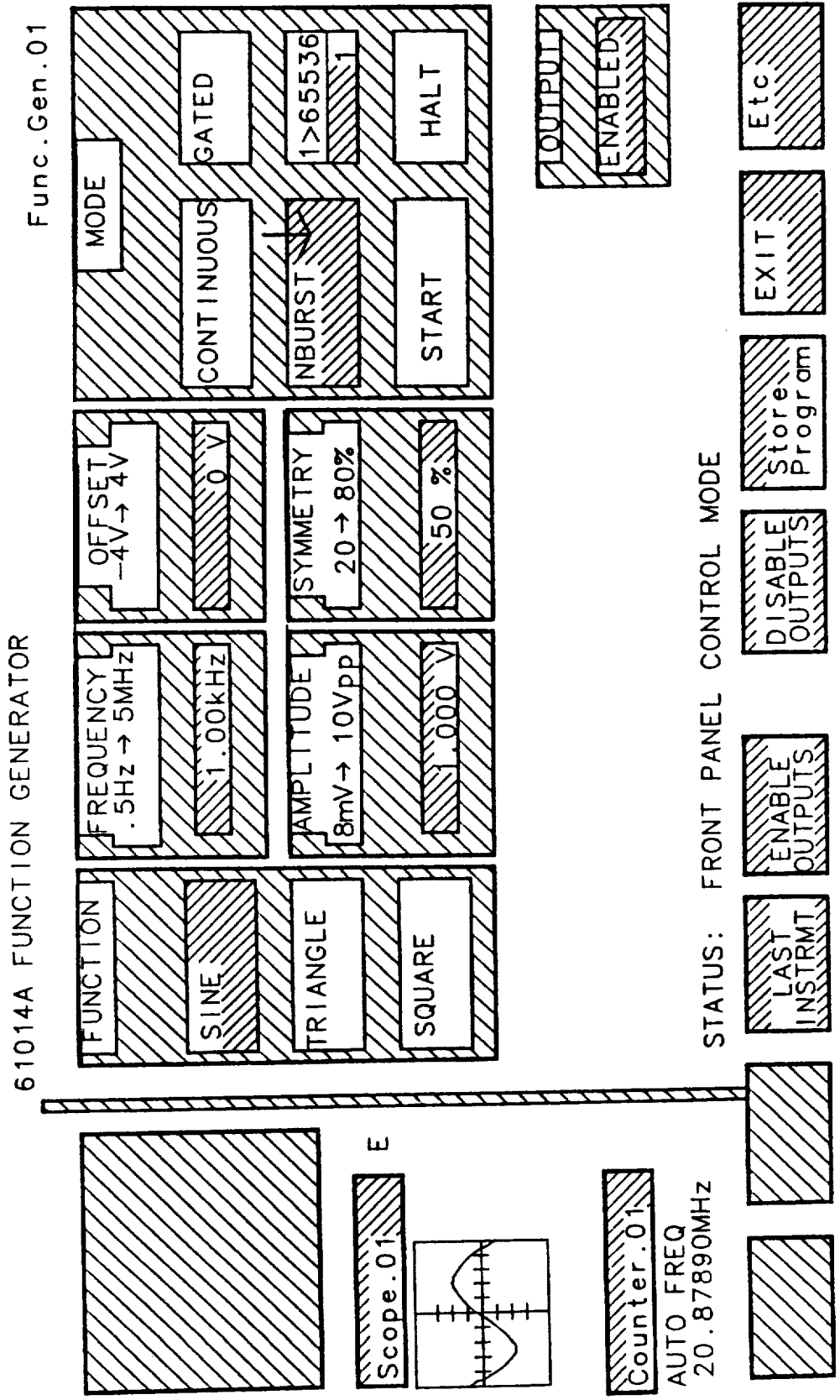
FIG. 9 shows the additional control components made available on a function generator when it is in the NBURST mode of operation.
Figure 10:
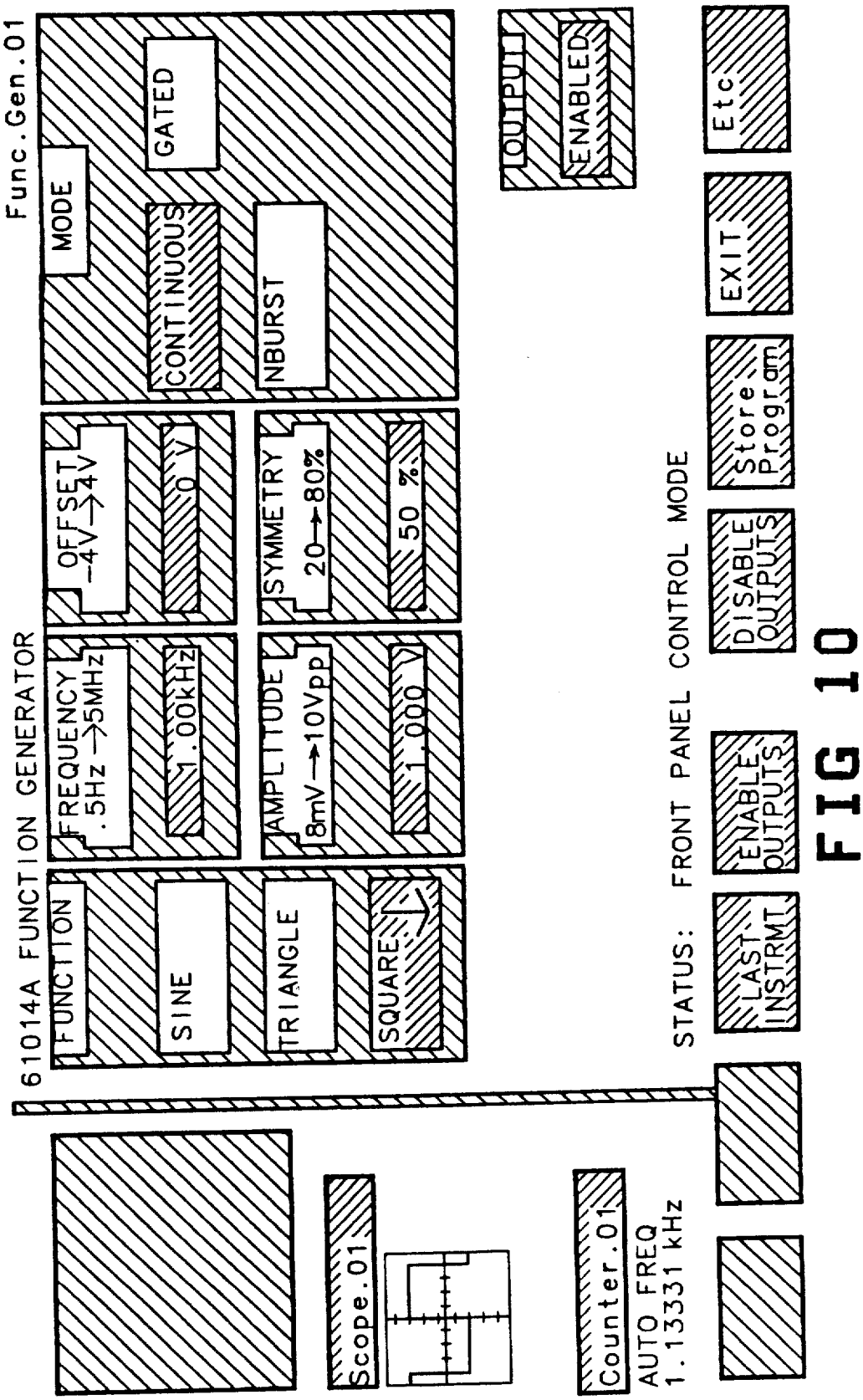
FIG. 10 illustrates the change in the SVW for the oscilloscope when the square wave control component of the function generator in the IIW is activated.

At this point, the computer display will appear as in FIG. 9.

This step completes servicing of the operator selection in the IIW. The program returns to the beginning of the WHILE loop, step (9), to poll the instruments for service requests again.

(20) [erase the IIW]

The program branches to here if the cursor was located within an SVW when the selection was made.

Figure 11:
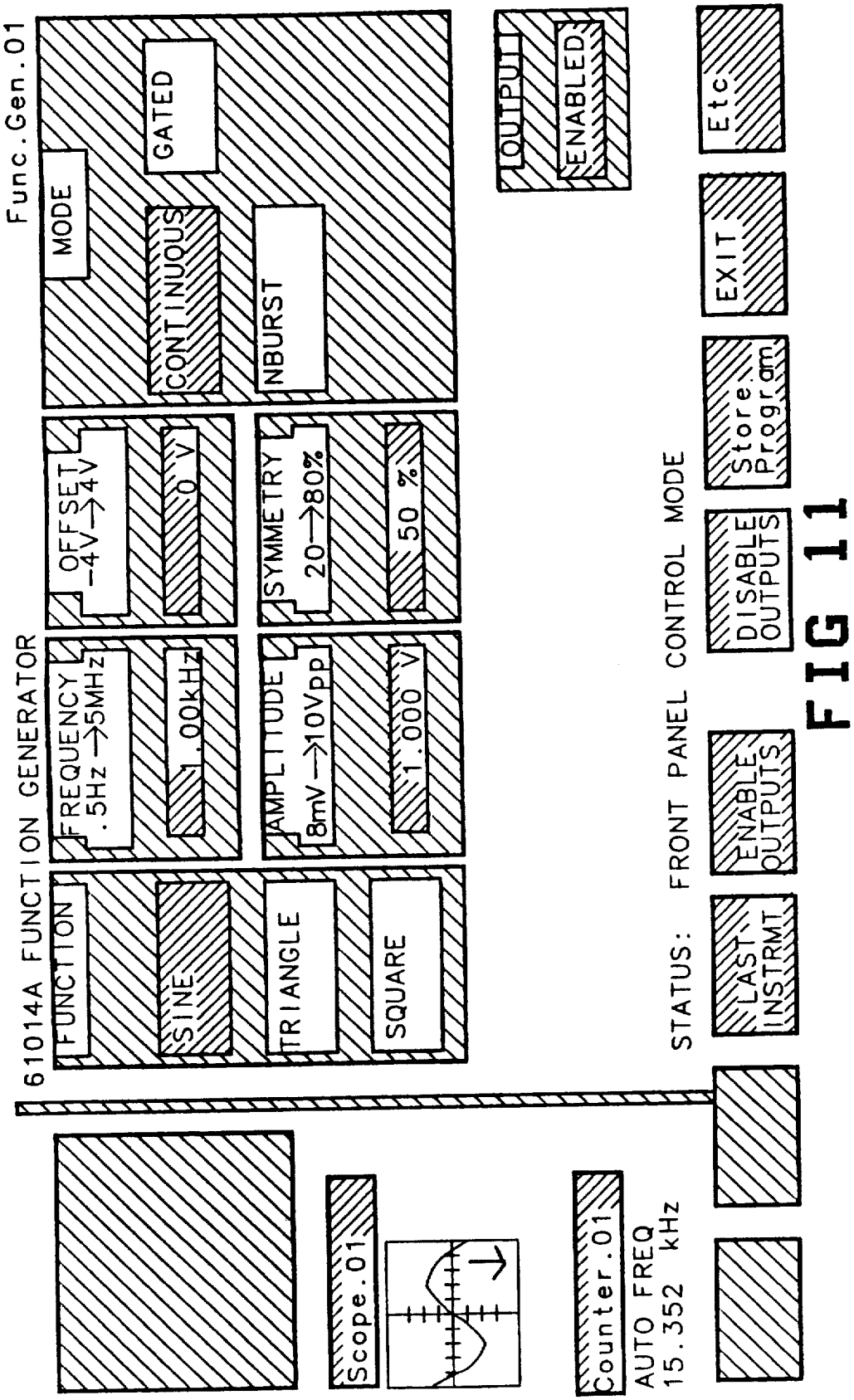
FIG. 11 illustrates the position of the cursor required to put the oscilloscope into the IIW.

Assume that just prior to the selection being made, the computer display appeared as in FIG. 11, with the cursor placed within the limits of the SVW for the oscilloscope. Then the operator clicked the mouse, causing the program to eventually get to this step.

The window list is walked to get the (x.y) and (dx,dy) coordinates of the window representing the IIW. The current IIW is erased by box-filling the entire area of the window with a white pattern.

(21) [update SVW for instrument that was just in IIW]

Up until now, the SVW associated with the function generator has been filled with a half-tone pattern. It now must be drawn showing the actual SVW representation for the function generator.

The window list is walked, comparing the "Corresponding Instrument" field of the IIW window with the "Corresponding Instrument" field of the SVW window until the matching SVW is found. Then, using the "Component Template Pointer" and the "Corresponding Instrument" fields, the "Create Window" routine is executed for the function generator SVW.

(22) [draw the IIW for the instrument whose SVW was selected]

The "Corresponding Instrument Pointer" field of the SVW which was selected is used to obtain the "IIW Component Template Pointer" of the instrument which is about to be represented in the IIW. This pointer is written into the "Component Template Pointer" field of the IIW window entry. The "Corresponding Instrument Pointer" field from the selected SVW window is also copied into the same entry of the IIW window.

Finally, the "Create Window" routine is called, using the "Component Template Pointer" and "Corresponding Instrument Pointer" of the new IIW as parameters.

(23) [half-tone the SVW for selected instrument]

The "Corresponding Instrument Pointer" field of the SVW which was selected is used to obtain the "SVW Window Pointer" of the instrument which was just drawn in the IIW. "Update Window" for this SVW is called with mode=HALF-TONE, in order to remove the instrument's representation from the SVW, since it is now in the IIW.

Figure 12:
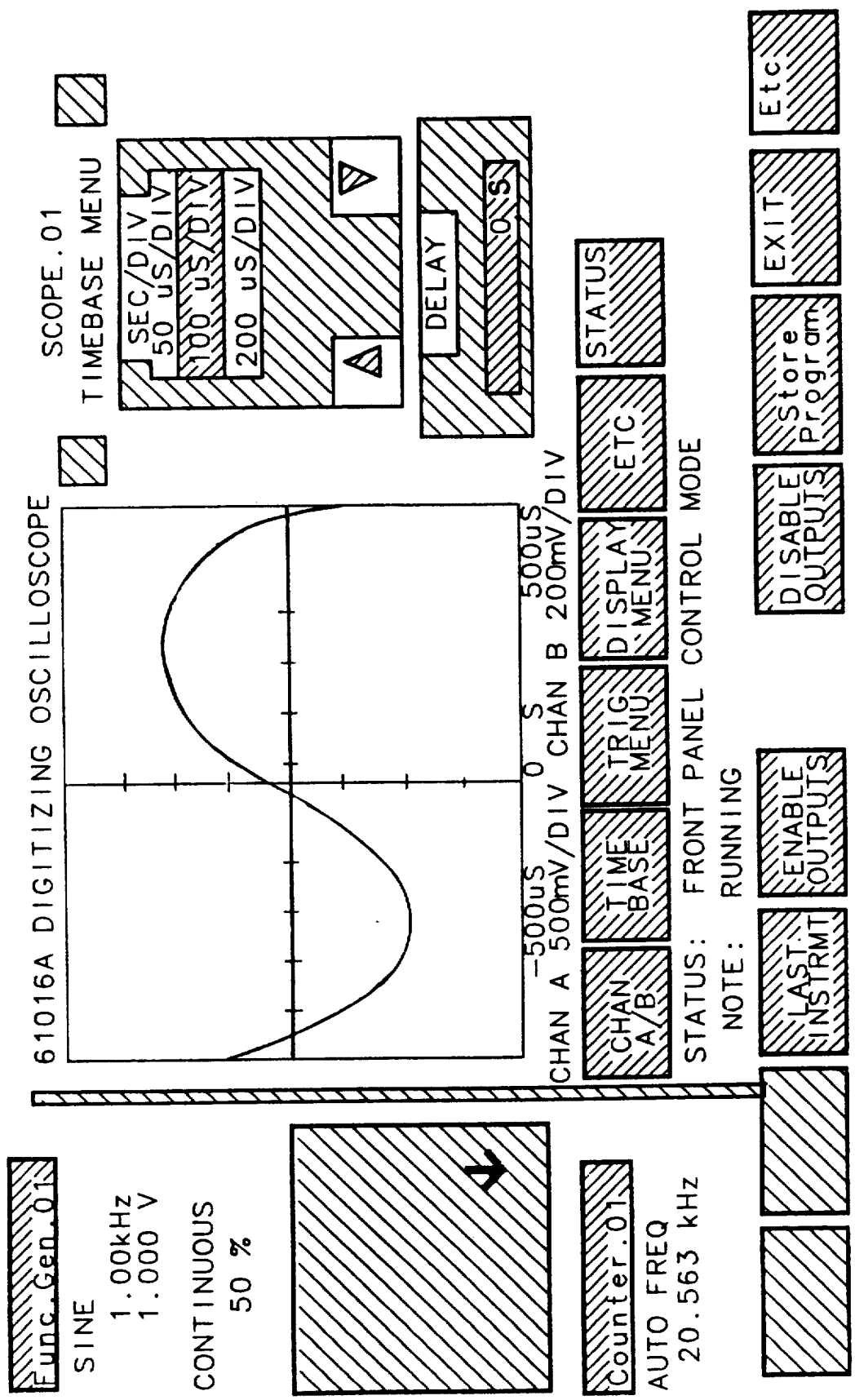
FIG. 12 shows the function generator in its SVW and the oscilloscope in the IIW.
Figure 13:
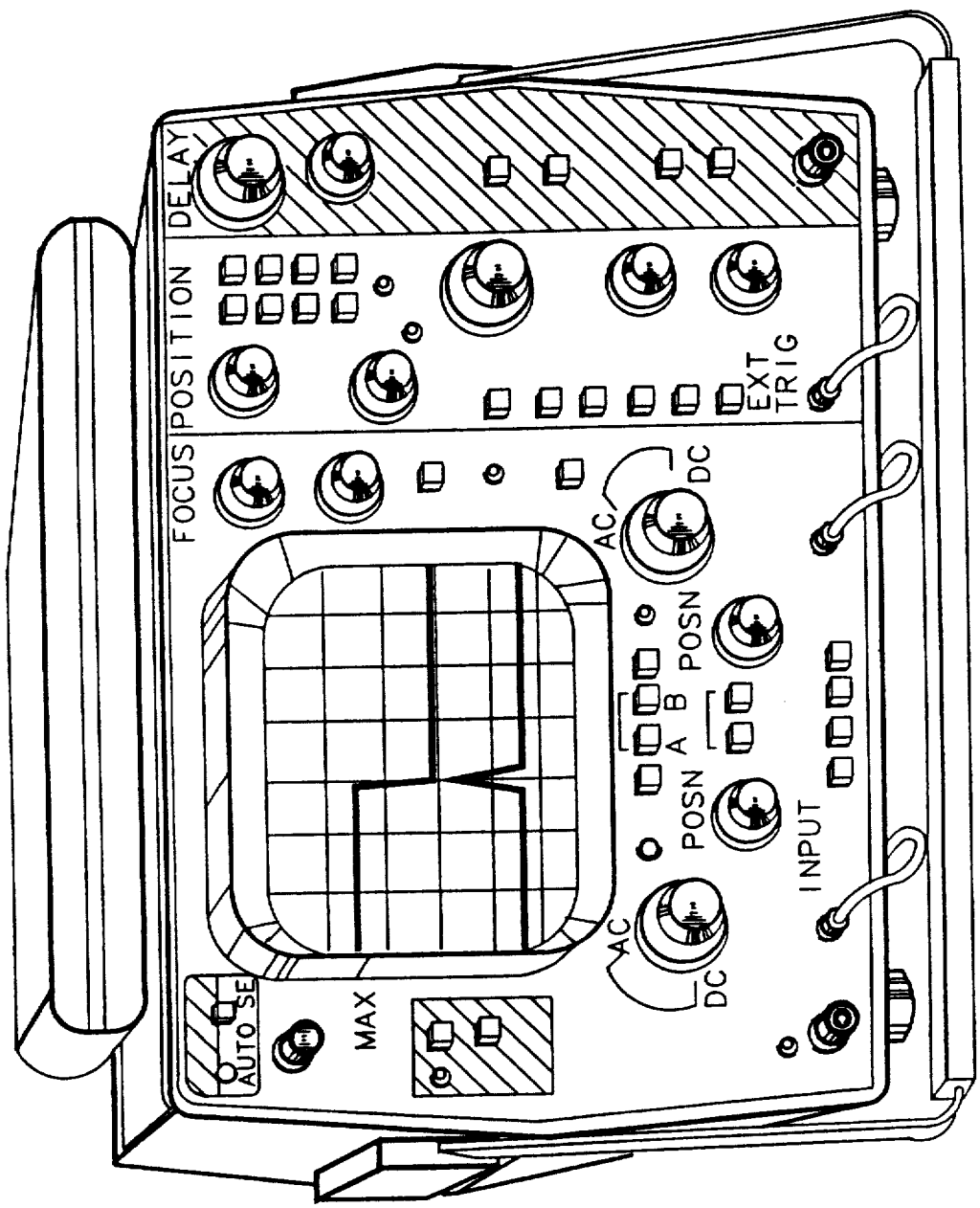
FIG. 13 shows the front panel of an HP oscilloscope.

The result of steps (20) through (23) are shown in FIG. 12.

This step completes servicing of the operator's selection of a SVW. The program returns to the beginning of the WHILE loop, step (9), to poll the instruments for service requests again.

(24) OTHERWISE [beep]

If the coordinates of the selection made by the user did not fall within either a SVW or the IIW, the operator is alerted to the fact that no action will take place.

(25) [execute system function associated with softkey]

If the user input was the pressing of a system softkey, the action associated with the softkey is processed here. Softkeys provide system-wide functions in this particular implementation of the invention, and are used to assist with entering or modifying numeric values. They will not be discussed any further since they do not directly relate to the patent.

Note, however, that one of the softkeys is the "Exit" softkey, which will cause termination of the program.

What is claimed is:

1. A system comprising:
   control means and an instrument, said instrument having a number of possible states comprised of different combinations of operating parameters,
   said control means having viewing means,
   means for simultaneously displaying on said viewing means controls and indicators that are interactive with said instrument and denote a first state of the instrument and other controls and indicators pertinent to said first state, the controls and indicators denoting the first state being visually emphasized with respect to the representation of other controls and indicators,
   means for placing the instrument in a second state, and
   means responsive to the instrument being in said second state for showing on said viewing means controls and indicators denoting said second state, erasing from said screen controls and indicators that are not pertinent to the second state, forming on said viewing means controls and indicators that are in pertinent to the second state, [forming on said viewing means controls and indicators that are pertinent to the second state] but not pertinent to the first state and visually emphasizing controls and indicators denoting the second state.

2. An instrument as set forth in claim 1 wherein said viewing means is provided by a cathode ray tube and wherein means are provided for actuating a visually de-emphasized control, said last mentioned means including:
   means for locating a cursor at desired points on said viewing means, and
   means responsive to a cursor being located on a de-emphasized control for causing said control to interact with the instrument.

3. A system as set forth in claim 1 wherein said means for simultaneously displaying controls and indicators displays them so as to simulate the controls and indicators of an instrument.

4. An instrument system comprising:
   a plurality of instrument and control means for said instruments,
   said control means having viewing means,
   means for displaying indicators in respective first areas of said viewing means for said instruments,
   means for selecting one of said first areas on said viewing means,
   means responsive to the selection of one of said first areas for displaying in a second area of said viewing means controls and indicators for a given state of the instrument corresponding to said one area and other controls and indicators that are pertinent to said given state, the controls and indicators for said given state being visually emphasized with respect to said other controls and indicators,
   means for activating one of the other controls in said second area so as to cause the instrument to enter a new state,
   means responsive to the instrument being in a new state for erasing from said screen any controls and indicators that are not pertinent to the new state, forming on said screen controls and indicators that are pertinent to the new state but not pertinent to the given state and visually emphasizing controls and indicators for the new state, and
   means for updating appropriate indicators in said first areas in response to the said activating of one of the controls in said second area.

5. An instrument comprising:
   a cathode ray tube having a viewing screen,
   means for displaying on said screen interactive controls and indicators for a first state of the instrument and other controls and indicators that are useful in conjunction with said first state,
   means for interacting with the instrument so as to place the instrument in a second state, and
   means responsive to the instrument being in a second state for erasing from said screen controls and indicators that are not useful in conjunction with the second state, forming on said screen controls and indicators that are useful in conjunction with the second state, but not useful in conjunction with the first state.

6. Apparatus for controlling an instrument comprising:
   a viewing screen;
   means for displaying on said screen controls and indicators interacting with the instrument that represent the current values of those modifiable parameters which comprise a first state of the instrument and other controls and indicators representing alternative values of the modifiable parameters, the activation of at least one of which would set the instrument into a second state, with the controls and indicators representing the parameter values of the first state being visually emphasized with respect to the other controls and indicators, means for making at least one of the other controls interact with the instrument so as to place the instrument in a second state, and means responsive to the instrument being in the a second state for erasing from said screen controls and indicators that represent modifiable parameters which are unnecessary in the second state, forming on said screen controls and indicators that represent values of modifiable parameters that comprise the second state of the instrument and controls and indicators that represent alternative values of the modifiable parameters of the second state, and visually emphasizing the controls and indicators representing the values of the modifiable parameters of the second state with respect to the controls and indicators that represent alternative values of the modifiable parameters of the second state.

* * * * *

UNITED STATES PATENT AND TRADEMARK OFFICE
CERTIFICATE OF CORRECTION

PATENT NO. : 5,309,556
DATED      : May 3, 1994
INVENTOR(S): Robert Sismilich It is certified that error appears in the above-indentified patent and that said Letters Patent is hereby corrected as shown below:

Claim 1, Column 19, Line 68:  Between "are" and "pertinent" delete "in";

Claim 1, Column 19, Line 68 & Claim 1, Column 20, Lines 1-2: The words "forming on said viewing means controls and indicators that are pertinent to the second state" should have been deleted.

Signed and Sealed this

Sixteenth Day of May, 1995

*Attest:*

BRUCE LEHMAN

*Attesting Officer*       *Commissioner of Patents and Trademarks*